(12) United States Patent
Mobley et al.

(10) Patent No.: US 7,533,231 B1
(45) Date of Patent: May 12, 2009

(54) METHOD AND CIRCUIT FOR INCREASING THE MEMORY ACCESS SPEED OF AN ENHANCED SYNCHRONOUS MEMORY

(76) Inventors: Kenneth J. Mobley, 17070 Remington Rd., Colorado Springs, CO (US) 80908;
Michael T. Peters, 3020 Blodgett Dr., Colorado Springs, CO (US) 80919;
Michael Schuette, 5555 Shoup Rd., Colorado Springs, CO (US) 80908

( * ) Notice: Subject to any disclaimer, the term of this patent is extended or adjusted under 35 U.S.C. 154(b) by 0 days.

(21) Appl. No.: 10/965,602

(22) Filed: Oct. 13, 2004

Related U.S. Application Data

(63) Continuation of application No. 10/178,072, filed on Jun. 20, 2002, now Pat. No. 6,813,679.

(51) Int. Cl.
*G06F 13/14* (2006.01)
(52) U.S. Cl. ..................................... 711/167
(58) Field of Classification Search ................. 711/101, 711/105, 167, 168
See application file for complete search history.

(56) References Cited

U.S. PATENT DOCUMENTS

| | | | |
|---|---|---|---|
| 5,680,363 A * | 10/1997 | Dosaka et al. | 365/230.03 |
| 5,692,148 A * | 11/1997 | Kundu | 711/105 |
| 5,699,317 A | 12/1997 | Sartore et al. | |
| 5,721,862 A | 2/1998 | Sartore et al. | |
| 5,748,914 A * | 5/1998 | Barth et al. | 710/105 |
| 5,787,457 A | 7/1998 | Miller et al. | |
| 6,141,281 A | 10/2000 | Mobley et al. | |
| 6,289,413 B1 | 9/2001 | Rogers et al. | |
| 6,330,636 B1 | 12/2001 | Bondurant et al. | |
| 6,347,357 B1 | 2/2002 | Sartore et al. | |
| 2004/0225852 A1 * | 11/2004 | Peters | 711/167 |

* cited by examiner

*Primary Examiner*—Kevin L Ellis
(74) *Attorney, Agent, or Firm*—McDonnell Boehnen Hulbert & Berghoff LLP

(57) ABSTRACT

A memory and method for operating it provide for increased data access speed. In an implementation, a synchronous memory or SDRAM includes a central memory region with memory blocks arranged in sets on respective opposite sides. A number of primary sense amplifier sets are provided, each set being associated with a respective set of the memory blocks and located adjacent. A row cache is provided in the central memory region, and row decoders decode a row address in response to a "bank activate" command and move data from a decoded row address into a primary sense amplifier set associated with a memory block containing the decoded row address and into the row cache, before application of a "read" command to the SDRAM. Column decoders decode a column address in response to a "read" command and for reading data from the cache in accordance with the decoded column address.

28 Claims, 4 Drawing Sheets

METHOD AND CIRCUIT FOR INCREASING THE MEMORY ACCESS SPEED OF AN ENHANCED SYNCHRONOUS MEMORY

CROSS-REFERENCE TO RELATED APPLICATION

This application is a continuation application of U.S. application Ser. No. 10/178,072, filed on Jun. 20, 2002, which is incorporated by referenced.

BACKGROUND OF THE INVENTION

1. Field of the Invention

This invention relates to improvements in memory architectures and methods for operating same, and more particularly, to improvements in memory architectures and operations thereof for increasing the speed of data transfers between the memory array and a cache memory associated therewith.

2. Relevant Background

During recent years, the memory industry has begun to widely use synchronous DRAMs (SDRAMs). SDRAMs have begun to be so commonplace, that often the reference to its synchronous nature is dropped, and they are referred to simply as DRAMs. However, to avoid confusion, synchronous DRAMs will be consistently referred to herein as "SDRAMs".

As SDRAMs have developed, they have been operated at ever increasing clock speeds. The SDRAMS of the second generation were called double data rate (DDR) SDRAMs, and are now often referred to as "DDR-I" SDRAMs. In the second generation of synchronous SDRAMs, clock frequencies of 133 megahertz were common. Recently, a third new generation of synchronous SDRAMs are being defined to operate at speeds of two times or greater than DDR-I SDRAMs, and are sometimes referred to as "DDR-II" SDRAMs.

The clock frequencies presently being investigated for DDR-II SDRAMs are on the order of about 200 megahertz to 400 megahertz. Although the clock frequencies of the SDRAMs have been increasing, the actual signal delays as the signals propagate through the memory circuitry have not been concomitantly decreased. Thus, one might expect that an increased clock speed applied to an SDRAM might increase the data rate available from the SDRAM, or, alternatively, reduce the access time to the data in the SDRAM. However, the memory elements themselves in the SDRAMs are generally substantially the same, and therefore, require the same amount of access time, regardless of the clock speed. Thus, an increased clock speed generally only enables a random bit of data to be accessed in about the same time frame as devices with lower clock speeds. As a result, devices that operate at higher clock speeds merely require a larger number of clock cycles to access the data in the same time frame.

To address the goal in the design of memory devices of achieving increased random access speeds, it has been proposed to include cache memory elements in the device into which the contents of the SDRAM array may be temporarily stored prior to being delivered to the output of the memory. As used herein, the term "cache" or "cache memory" is used to refer to a data latch, register, memory, or other suitable circuit that can temporarily hold or store data read from a memory array prior to being delivered to the output of the memory. Among other things, the cache memory serves to reduce the overhead associated with the SDRAM array by allowing data access to occur while the precharge and next activation of the array is underway. This effectively speeds up the overall data rate by eliminating otherwise dead periods.

Thus, when an element from the memory array is read, it is detected by a sense amplifier that is associated with the memory cell being read, then subsequently delivered from the sense amplifier to the cache memory element that is at least temporarily associated therewith. One example of a memory array having a cache memory is shown in copending patent application Ser. No. 09/689,219, filed Oct. 11, 2000, the application being assigned to the assignee of this application, and incorporated by reference.

Today, in memory architectures, in general, and SDRAM architectures, in particular, one physical circuit layout that has been suggested includes sets of sense amplifiers alternating with memory array blocks serviced by the sense amplifiers. See, for example, U.S. Pat. No. 5,887,272, which is assigned to the assignee of this application, and which is incorporated by reference. The sense amplifiers are arranged in stripes between adjacent SDRAM array blocks. Each sense amplifier stripe may be connected to selectively service the SDRAM cells on both sides of the stripe. Thus, the sense amplifiers in a particular sense amplifier stripe may be selectively connected to selected memory cells on either the memory array located on left of the stripe, or to selected memory cells located on the right of the stripe.

Additionally, memory arrays are becoming increasingly dense. For example, SDRAM designers are under constant tension to design SDRAM circuits more densely, but at the same time, to include larger amounts of functionality in the circuit. One of the techniques that integrated circuit manufacturers have used to address these problems is to place greater and greater emphasis on multilayered structures. For example, above the active regions of the device, one or more layers of interconnecting metal or other conducting material, such as polysilicon, or the like, may be used. However, as the number of the layers increases, the planarity of the surface on which subsequent layers are formed becomes increasingly uneven. As a result, the overlying or subsequently formed structures have a tendency to be susceptible to discontinuities, due to step-like structures that form at the surface. As a result, the pitch of the interconnect structures generally cannot be designed at too low a level. (The pitch of an interconnect is regarded as the distance between an interconnect structure and its closest neighbor, plus the dimension of the interconnect itself.)

One SDRAM example is class of SDRAM devices, called the "Enhanced SDRAM," or "ESDRAM," which has been recently introduced by Enhanced Memory Systems, Inc of Colorado Springs, Colo. An example is the SM2603 and SM2604 Enhanced SDRAM (ESDRAM) devices, which are a 64 megabit JEDEC superset standard SDRAM. While pin, function, and timing are compatible with standard SDRAMs, they have a speed and architecture that optimizes system price-to-performance in high performance main memory, video graphics, and embedded systems.

This 64 megabit ESDRAM is a high-speed SDRAM configured as four banks of SDRAM with an SRAM row cache per bank and a synchronous interface. All inputs are registered and all outputs are driven on rising clock edges. Within each bank, the devices are organized as 4096 rows of 4096 bits each. Within each row, the 8M×8 device has 512 column address locations and the 4M×16 device has 256 column locations. Read and write accesses are accomplished by opening a row and selecting a column address location for the transaction. A "bank activate" ("ACT") command instructs the device to open a row in one of the four banks, though all four banks may be active simultaneously. A subsequent "read" or "write" command instructs the device to read data from or write data to a specified column address location.

On a random read access, an SDRAM bank is activated and data is latched into the sense amplifiers. The sense amplifiers now hold a row of data and the row is considered open. A "read" command now causes the entire row to latch into the SRAM row cache, and the data at a specified column address location is driven out. Since the row data is latched into the SRAM row cache, the SDRAM sense amplifiers are decoupled from the data. Therefore, the SDRAM precharge time can be hidden behind a burst read from the row cache. This minimizes subsequent page miss latency. Since both precharge and row address strobe (RAS) to column address strobe (CAS) delays are hidden, the device supports an industry leading CAS latency of one at clock frequencies up to 83 megahertz, and CAS latency of two up to 166 megahertz. At 166 megahertz, all but one cycle of the next random access to any location in the same bank can be hidden. This SDRAM dramatically increases sustained bandwidth by up to two times over standard SDRAM. For interleaved burst read accesses, the entire precharge time is hidden and output data can be driven without any wait states.

Nevertheless, it may be possible to increase still further the data access time of the device.

SUMMARY OF THE INVENTION

In light of the above, therefore, in an implementation, the invention provides an improved memory integrated circuit device, especially a synchronous memory integrated circuit device such as an SDRAM.

In an implementation, the invention provides a synchronous memory array in which a row, or other portion, of the synchronous memory can be read and transferred to a cache memory upon receipt of a "bank activate" command to increase the access time of the device.

These and other objects, features and advantages of the invention will be apparent to those skilled in the art from the following detailed description of the invention, when read in conjunction with the accompanying drawings and appended claims.

According to a broad aspect of the invention, a method is presented for reading data from a synchronous memory of the type having data cells arranged in rows and columns and having a row cache. The method includes receiving an initial command and row address data for reading contents of a row of the memory selected by the row address data in response thereto. The contents of the row selected by the row address data are moved into the row cache, without an intervening command, such as a "read" command. After the contents of the row have been moved into the row cache, a "read" command and column address data are received. In response to the "read" command, data is read from the row cache at a column address specified by the column address data for output by the memory.

According to another broad aspect of the invention, a synchronous memory is presented. The synchronous memory includes a row cache and means for receiving an initial command substantially concurrently with row address data and activating for reading a row of the memory selected by the row address data in response thereto. Means for moving the contents of the row of the memory selected by the row address into the row cache are provided, and means for receiving a "read" command substantially concurrently with column address data after the contents of the row has been moved into the row cache are also provided. Means for reading data from the row cache at a column address specified by the column address data in response to the "read" command are provided as well as means for moving the data read from the row cache to an output of the memory after a predetermined number of clock cycles thereafter.

According to yet another broad aspect of the invention, an SDRAM adapted to receive "bank activate" and "read" commands is provided. The SDRAM includes a central memory region and a number of memory blocks arranged in first and second sets on respective opposite sides of the central memory region. A number of primary sense amplifier sets are provided, each set associated with a respective pair of the memory blocks and located adjacent thereto. A row cache is provided in the central memory region, and row decoders decode a row address in response to a "bank activate" command and move data from a decoded row address into a primary sense amplifier set associated with a memory block containing the decoded row address and into the row cache, prior to application of a "read" command to the SDRAM. Column decoders decode a column address in response to a "read" command and for reading data from the row cache in accordance with the decoded column address.

BRIEF DESCRIPTION OF THE DRAWINGS

The invention is illustrated in the accompanying drawings, in which.

DETAILED DESCRIPTION OF THE INVENTION

As mentioned above, although the clock frequencies of synchronous SDRAMs (SDRAMs) have been increasing, the actual signal delays as the signals propagate through the memory circuitry have not been concomitantly decreased. Typically, the outputs of an SDRAM are driven on the rising edge of the clock. Generally, four memory banks are organized, as desired, for instance, in four blocks, each containing 4096 rows of 4096 bits in a 64 Mbit device, or in some other convenient arrangement to form a memory device of other size. The blocks of a 64 megabit device may be arranged, for example, as an 8M×8 or 4M×16 SDRAM. For instance, in an 8M×8 device, 512 column address locations may be provided, and in a 4M×16 device, 256 column locations may be provided.

Typically, read accesses are accomplished by opening a row and subsequently selecting a column address location for the transaction. A "bank activate" command instructs the device to open a row in one of the four banks. A subsequent "read" command instructs the device to read data from a specified column address location.

Thus, in typical operation of a prior art device, when a row of data is desired to be accessed, a row selection is made, for example, concurrently with the "bank activate" command. The data at the selected row is transferred to primary sense amplifiers that are closely located to the block in which the selected row is contained. Then, when a subsequent "read" command is issued, column address data is applied to the SDRAM, and is propagated to the remotely located primary sense amplifiers. The data at the selected column address is then transferred back to secondary sense amplifiers in a central block of the device.

These transfers of selected row and column data all of the way out to the remote primary sense amplifier locations and the subsequent propagation of the data back from the primary sense amplifiers to the central secondary sense amplifiers or latches adds unnecessary time to the access time of the device. These propagation delays can be significant in terms of the recent speed demands that are placed on the SDRAMs. However, utilizing the cache memory embodiments described below and in the copending patent application Ser. No. 09/689,219, some of these delays can be significantly reduced.

Figure 1:
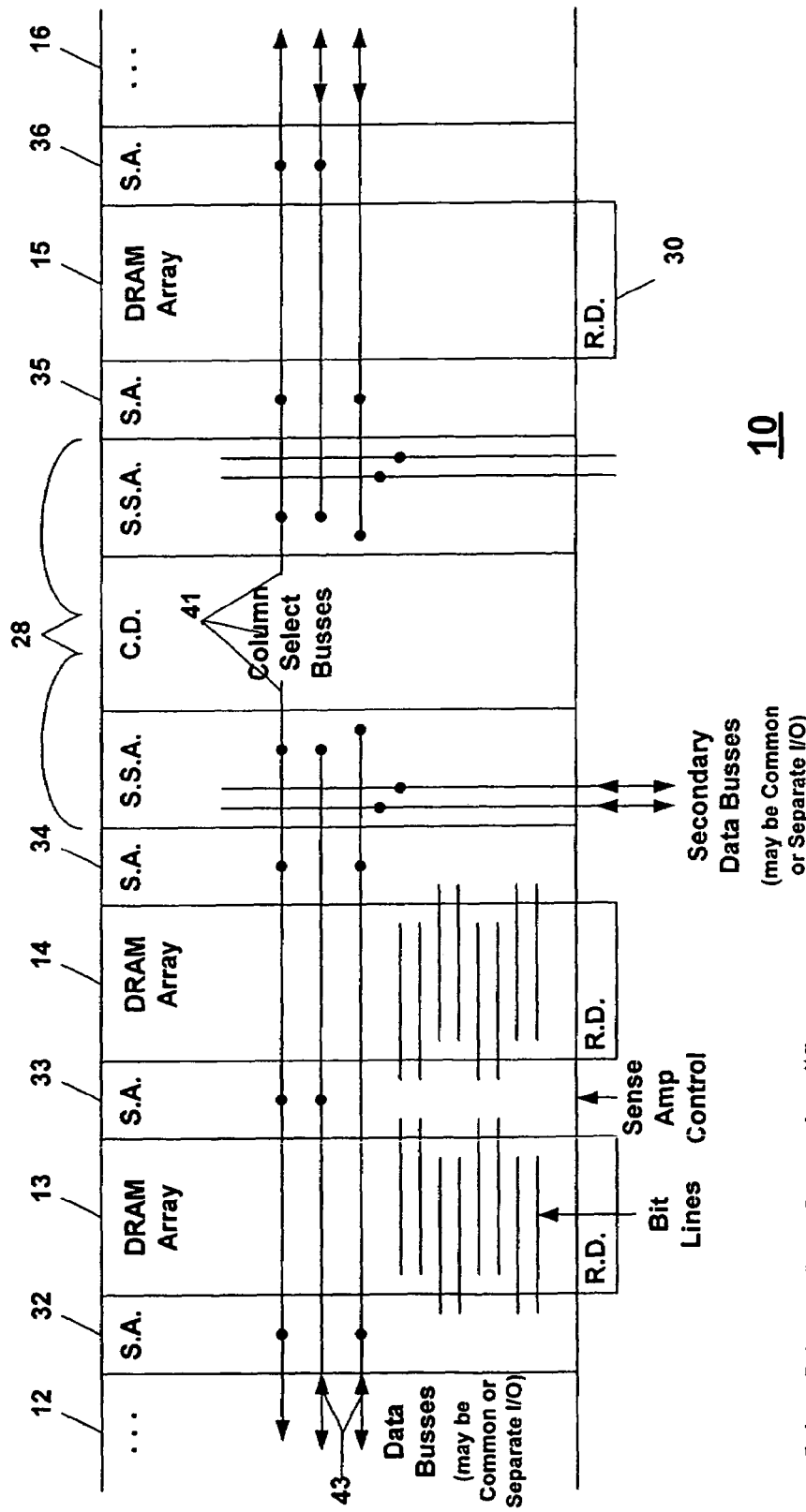
FIG. 1 is a diagram showing a physical SDRAM layout illustrating the relationship between the various SDRAM arrays, the sense amplifier stripes, and interconnecting buses, and illustrating the data movement patterns therein, in accordance with a typical embodiment of the prior art.

One prior art DDR-II SDRAM memory arrangement 10 that has been proposed is illustrated in the diagram of FIG. 1 to which reference is now made. The diagram of FIG. 1 shows a block diagram of a DDR-II SDRAM and the signal flow paths of interest therein. The SDRAM architecture 10 includes a number of memory blocks 12-16 arranged on either side of a central block 28 that contains central column decoders and secondary sense amplifiers. Beneath each of the sections of memory blocks 12-16 are respective row decoders 30. The memory blocks 12-16 are arranged in respective sections on each side of the central block 28, and a number of such memory arrangements may be included in a single device.

Typically, primary row sense amplifiers are located in spaces 32-36 between respective pairs of the memory blocks 12-16, so that they may be shared in operation. For example, a set of primary row sense amplifiers may be located in the space 32 between memory blocks 12 and 13, another in the space 33 between memory blocks 13 and 14, and so on.

The primary row sense amplifiers to the right of the memory block 12 at the furthest distance from the block 28 represents the worst case column decode delay, since the column identification data must travel the furthest to reach the primary sense amplifiers at this location. However, delays are also inherent with respect to the primary sense amplifiers at the other locations as well. It is important to note that, while sense amplifiers are shown shared between adjacent memory blocks, the sense amplifiers need not be shared or staggered in any specific implementation.

Thus, in operation, first when a "bank activate" signal is applied to the device, row address data is applied substantially concomitantly, or in association therewith. The row address is transmitted to the desired row location, and the data contained at the selected row is moved from the memory block in which it is contained to the primary row sense amplifiers associated therewith. For example, if the row selected is contained in block 13, the data in the selected row is transferred to the primary sense amplifiers in spaces 32 and 33 adjacent to and associated with.

Subsequently, when a "read" command is applied to the device 10, substantially concomitantly or in association with column address, the column address is transmitted to the location of the primary sense amplifiers that contain data at the previously selected row address, for example along path 41. The data at the column address in the selected row is then returned along bus path 43 to the secondary sense amplifiers within the central block 28 for subsequent transfer to the input/output or I/O pins of the device. If desired, a burst length, for example, of four or more words, may be driven back across the array to the secondary sense amplifiers, prefetched into a buffer, and pipelined to the output pins.

It can be seen that this results in a signal propagation delay, at worst, of two times one-half of the memory distance of the memory banks of the array if the sense amplifiers of the selected row are located between the outermost memory blocks. Memory requests in most computer systems occur in multiple in-page (within same row) read requests. A standard DDR-II device should keep the row active in order to service more than one "read" command. Therefore, the device must incur the path delays of lines 41 and 43 for every in-page read cycle.

In contrast, according to a preferred embodiment of the invention, the propagation delay of an SDRAM is significantly reduced by taking advantage of the existence of an on-board or on-chip cache to receive the entire selected row of data immediately upon the receipt of the "bank activate" signal. According to the invention, the data contained in the selected row is entirely and immediately moved to the cache, although more than one bus transfer may be used. Thus, upon the subsequent receipt of the "read" command, only the column data needs to be decoded. This can be done locally in the cache, without requiring the column addresses to be propagated out into the memory array to retrieve the data thereat. This reduces the signal propagation delay by one-half of the memory distance to the selected memory banks of the array. This results in increasing the read and write operating speed of the device, and reducing the read latency to subsequent column address locations.

Figure 2:
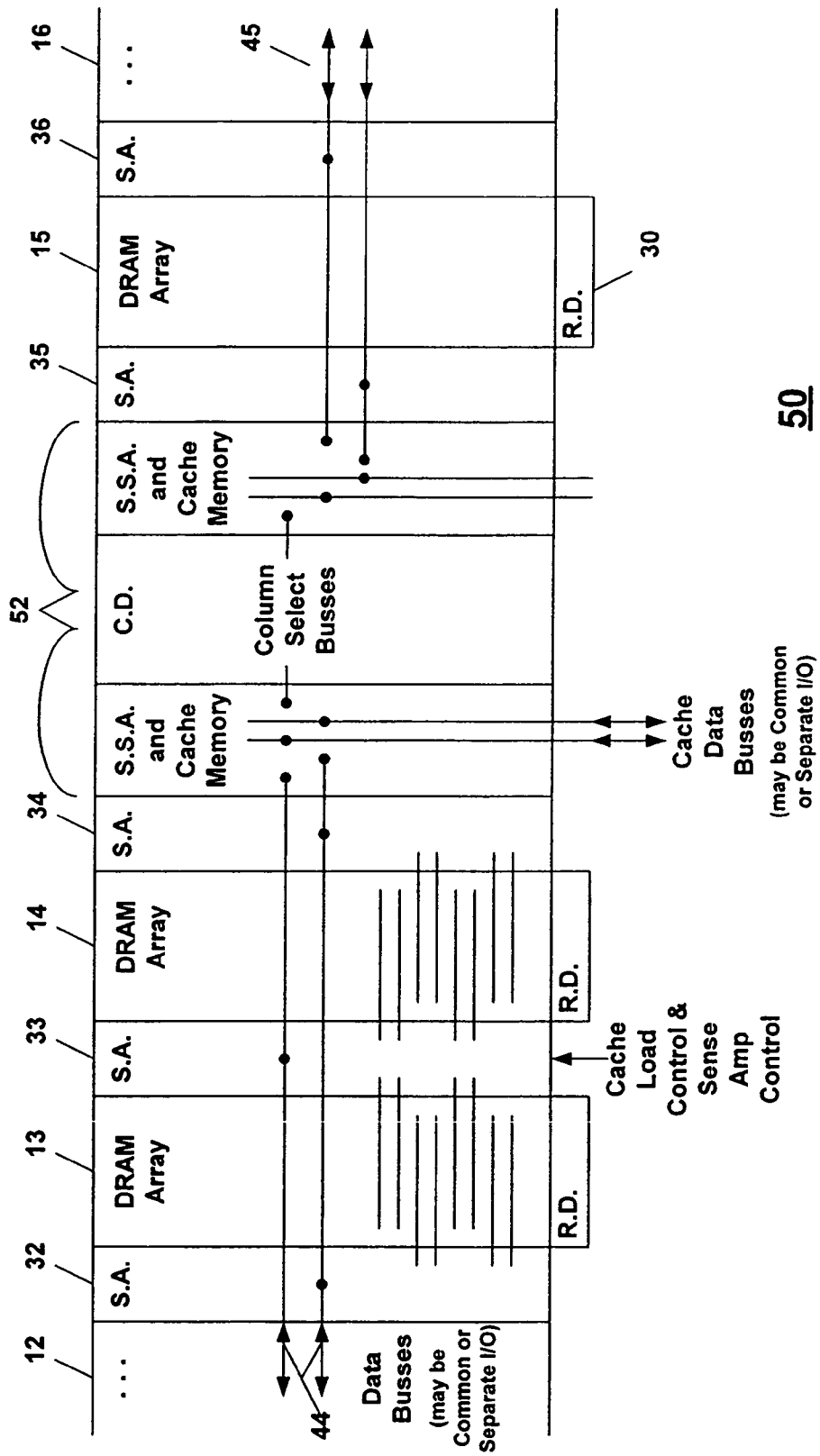
FIG. 2 is a diagram showing a physical SDRAM layout illustrating the relationship between the various SDRAM arrays, the sense amplifier stripes, the cache memory stripes, and the interconnecting buses, and illustrating the data movement patterns therein, in accordance with a preferred embodiment of the invention.

A diagram of an SDRAM architecture 50, according to a preferred embodiment of the invention, is shown in FIG. 2, to which reference is now additionally made. The SDRAM architecture 50 includes a number of memory blocks 12-16 arranged on either side of a block 52 that contains row decode, secondary sense amplifiers, and a data cache. Beneath each of the sections of memory blocks 12-16 are respective row decoders 30. The memory blocks 12-16 are arranged in respective sections on each side of the decoder, sense amplifier, and cache block 52.

In contrast to the prior art device of FIG. 1, the enhanced architecture includes a data cache in the central circuit block 52. The cache is used to latch the entire selected row data, and allows the SDRAM array to be precharged or refreshed while concurrently enabling access to the selected data.

In operation, upon receipt of the "bank activate" command, the device 50 decodes a row of data within a specified bank. The data contained in the decoded memory elements in a respective one of the memory blocks 12-16 are sensed in the respective primary sense amplifiers in the interspaces 32-36 between the blocks 12-16, and immediately conducted on buses 44-45 to the cache in the block 52.

Thereafter, when the "read" command and column address is received, the data contained in the cache in block 52 is decoded to select data cells at the selected column within the cache for output from the device. Since the data selected by the row address is entirely contained in the cache, the device can be operated in burst or page mode, with the particularly selected data being immediately ready for pipelined output from the cache. Thus, the secondary sense amps are utilized only during the initial bank activation (row decoding and cache loading) time. Multiple in-page (within same row) read requests may then be serviced out of the cache.

Figure 3:
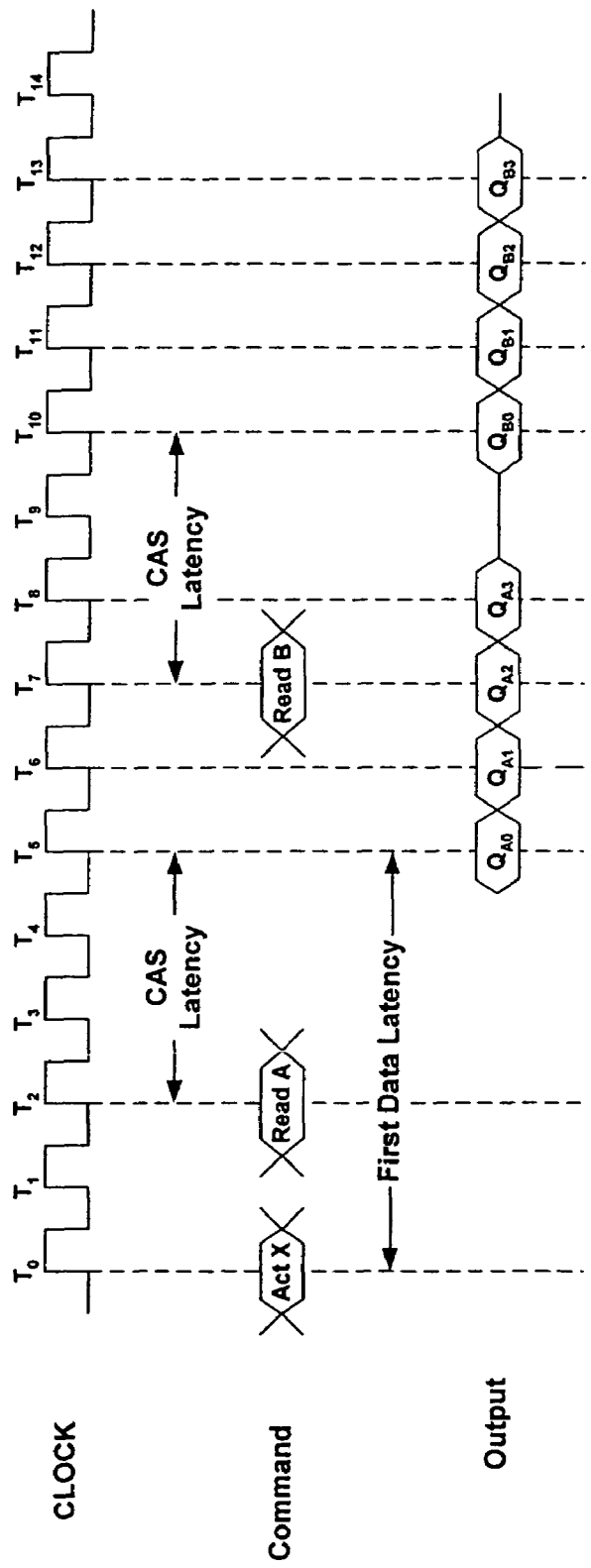
FIG. 3 shows timing diagrams and event occurrence timings in the operation of the memory of FIG. 1, without a row data cache in accordance with the prior art.
Figure 4:
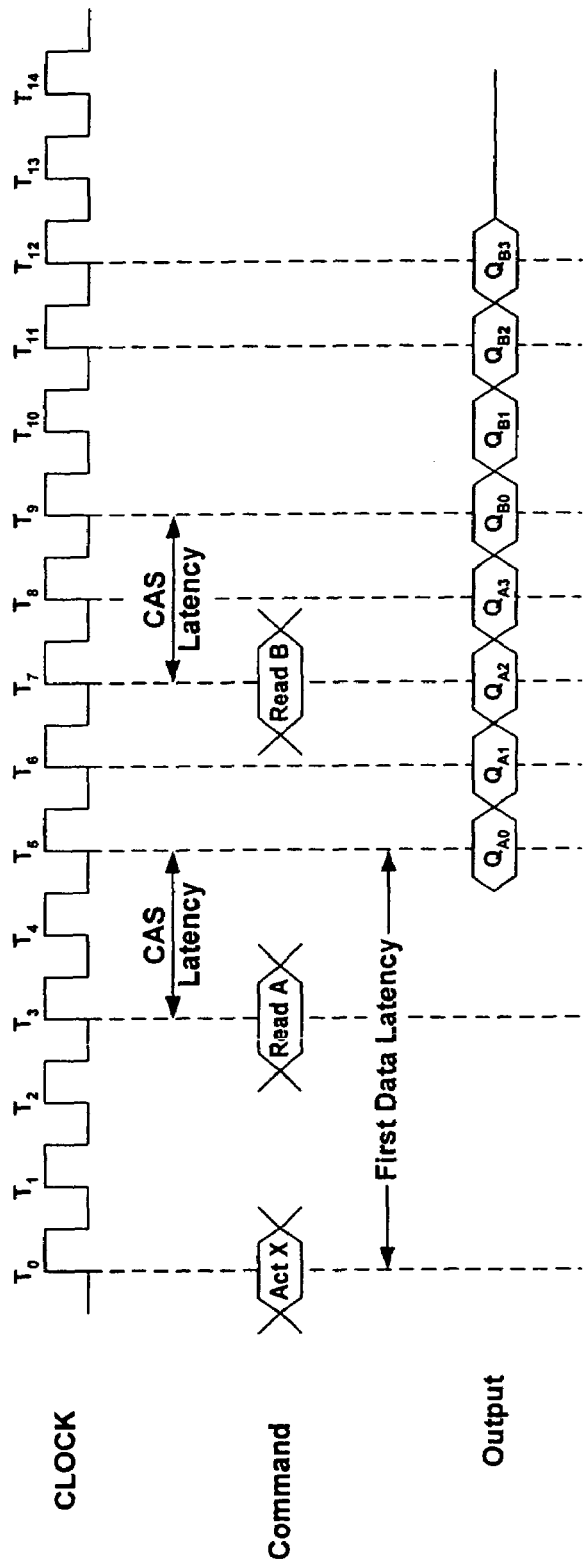
FIG. 4 shows timing diagrams and event occurrence timings in the operation of the memory of FIG. 2, in accordance with a preferred embodiment of the invention. In the various figures of the drawing, like reference numerals are used to denote like or similar parts.

The performance improvement of the method and architecture of the invention can be appreciated from a comparison of the prior art timing waveforms shown in FIG. 3 with the timing waveforms according to the present invention shown in FIG. 4.

As can be seen from the timing diagrams of FIG. 3, a first data latency of 5 and a CAS latency of 3 occurs due to the data transfer delays described above with respect to the operation of the memory architecture of FIG. 1. If a data cache is added, as shown in FIG. 4, the first data access still has a first data latency of 5, but with subsequent accesses having a CAS latency of 2.

Currently, DDR-II SDRAMs start at a 256 megabit density and a data rate of 400 megabits per second at a 200 megahertz clock frequency. Clock rates are expected to increase to 400 megahertz and beyond, which will likely increase the latencies in clock cycles to 4 or more. One clock cycle at 500 megahertz is only 2 nanoseconds. By caching the entire row and avoiding the column decode/data transfer times across the array, the CAS latency of the device is reduced by a clock cycle. Today's system benchmarks clearly demonstrate that reducing the data read latency yields up to 10 percent higher system performance.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

For example, in a nonmultiplexed device, the activate and read commands may be considered concurrent. Furthermore, while the drawings illustrate single data rate waveforms, the method and structure of the present invention can be adapted to double data rate operation as well.

What is claimed is:

1. A method for accessing data in a memory comprising one or more memory blocks, the method comprising:
   receiving a bank activate signal and row address data for reading contents of an identified row of memory identified by the row address data, wherein the memory comprises a row cache;
   responsive to the bank activate signal, using sense amplifiers to move the contents of the entire identified row of memory into the row cache in the absence of column address information at the location of the primary sense amplifiers, wherein the primary sense amplifiers are not shared between memory blocks;
   receiving a "read" command to access data from the identified row of memory, wherein the data to be accessed is less than the entire identified row;
   receiving column address data that identifies a location of the data to be accessed in the memory; and
   reading the data to be accessed from the contents of the identified row in the row cache at the location identified by the column address data, whereby permitting the one or more memory blocks to be refreshed concurrently with accessing the contents of the identified row in the row cache.

2. The method of claim 1 wherein the bank activate signal is received substantially concurrently with the row address data.

3. The method of claim 1 wherein the "read" command and the column address data are received substantially concurrently.

4. The method of claim 1 further comprising moving the data read from the row cache to an output of the memory after a predetermined number of clock cycles after the "read" command.

5. The method of claim 4 wherein the moving the data read from the row cache to an output of the memory after a predetermined number of clock cycles comprises moving the data read from the row cache to an output of the memory after two clock cycles.

6. The method of claim 4 wherein the predetermined number of clock cycles is two.

7. The method of claim 1 further comprising performing a first precharging operation prior to receiving the bank activate signal.

8. The method of claim 4 further comprising initiating a memory operation after the contents of the row have been moved into the row cache and before the data read from the row cache has been moved to the output of the memory.

9. The method of claim 8 wherein the memory operation is a precharging operation.

10. The method of claim 1 wherein the memory is a SDRAM array.

11. A memory comprising:
   one or more memory blocks;
   a row cache;
   circuitry to receive an initial command with row address data that identifies the row cache, wherein the initial command activates reading contents of at least one row storing the at least one row in the row cache;
   circuitry including sense amplifiers provided to move contents of the entire identified row of memory from the array of data cells into the row cache in the absence of column address data, wherein the primary sense amplifiers are not shared between memory blocks; and
   circuitry to receive a "read" command to access data from the identified row of in the memory, wherein the data to be accessed is less than the entire identified row;
   circuitry to receive column address data that identifies a location of the data to be accessed in the memory; and
   circuitry to read the data to be accessed from the contents of the identified row in the row cache at the location identified by the column address data, whereby permitting the one or more memory blocks to be refreshed concurrently with accessing the contents of the identified row stored in the row cache.

12. The memory of claim 11 wherein the initial command is received substantially concurrently with the row address data.

13. The memory of claim 11 wherein the "read" command is received substantially concurrently with the column address data.

14. The memory of claim 11 wherein the circuitry to receive an initial command comprises circuitry to receive an initial command substantially concurrently with the row address data.

15. The memory of claim 11 wherein the circuitry to receive a "read" command and the circuitry to receive column address data comprise circuitry to receive a "read" command and column address data substantially concurrently.

16. The memory of claim 11 wherein the circuitry to receive an initial command comprises means for receiving a "bank activate" command.

17. The memory of claim 11 further comprising circuitry to perform a first precharging operation before receiving the initial command.

18. The memory of claim 11 further comprising circuitry to move the data read from the row cache to an output of the memory after a predetermined number of clock cycles after the "read" command.

19. The memory of claim 18 wherein the circuitry to move the data read from the row cache to an output of the memory after a predetermined number of clock cycles comprises circuitry to move the data read from the row cache to an output of the memory after two clock cycles.

20. The memory of claim 18 wherein the predetermined number of clock cycles is two.

21. The memory of claim 18 further comprising circuitry to initiate a memory operation after the contents of the row of the memory have been moved into the row cache and before the data read from the row cache has been moved to the output of the memory.

22. The memory of claim 21 wherein the memory operation is a second precharging operation.

23. The memory of claim 14 wherein the one or more memory blocks comprise a SDRAM array.

24. A memory comprising:
a memory region;
a row cache associated with the memory region;
a plurality of memory blocks;
a plurality of primary sense amplifier sets associated with the plurality of memory blocks, wherein the primary sense amplifiers are not shared between memory blocks;
row decoders, each row decoder configured to:
decode a row address in response to a "bank activate" command, wherein the row address identifies one memory block in a row,
move data from the entire row associated with the decoded row address into the primary sense amplifier set that is associated with the one memory block identified by the decoded row address in response to a "bank activate" command, and
move the data for the entire row from the primary sense amplifier into the row cache in response to a "bank activate" command; and
column decoders, each column decoder configured to:
decode a column address in response to a "read" command, wherein the decoded column address identifies a location of data associated with the column address in the row cache, and
read the data from the location in the row cache that is identified by the decoded column address, wherein the data that is read is less than contents of the one memory block, whereby permitting the memory blocks to be refreshed concurrently with accessing the data for the entire row stored in the row cache.

25. The memory of claim 24 further comprising circuitry to move the data read from the row cache to an output of the memory after a predetermined number of clock cycles after the "read" command.

26. The memory of claim 24 further comprising circuitry to move the data read from the row cache to an output of the memory two clock cycles after the "read" command.

27. The memory of claim 24 further comprising circuitry to perform a first precharging operation before receiving the "bank activate" command.

28. The memory of claim 27 further comprising circuitry to perform a second precharging operation after the "bank activate" command and before the "read" command.

* * * * *